(12) United States Patent  
Foellmer et al.

(10) Patent No.: US 9,916,959 B2  
(45) Date of Patent: Mar. 13, 2018

(54) CATHODE FILAMENT ASSEMBLY

(71) Applicant: KONINKLIJKE PHILIPS N.V., Eindhoven (NL)

(72) Inventors: Marcus Walter Foellmer, Hamburg (DE); Zoryana Terletska, Hamburg (DE); Stefan Hauttmann, Buchholz (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 122 days.

(21) Appl. No.: 14/397,557

(22) PCT Filed: May 21, 2013

(86) PCT No.: PCT/IB2013/054181  
§ 371 (c)(1),  
(2) Date: Oct. 28, 2014

(87) PCT Pub. No.: WO2013/175402  
PCT Pub. Date: Nov. 28, 2013

(65) Prior Publication Data  
US 2015/0124931 A1     May 7, 2015

Related U.S. Application Data

(60) Provisional application No. 61/649,973, filed on May 22, 2012.

(51) Int. Cl.  
*H01J 35/06* (2006.01)  
*H01J 35/16* (2006.01)  
(Continued)

(52) U.S. Cl.  
CPC ................ *H01J 35/06* (2013.01); *H01J 1/18* (2013.01); *H01J 1/92* (2013.01); *H01J 9/042* (2013.01);  
(Continued)

(58) Field of Classification Search  
CPC .... A61B 6/00; A61B 6/40; A61B 6/44; H05G 1/00; H05G 1/02; H05G 1/04; H05G 1/08;  
(Continued)

(56) References Cited

U.S. PATENT DOCUMENTS 2,019,600 A * 11/1935 Ehrke ................. H01J 35/06  
                                              313/271  
2,290,226 A * 7/1942 Du Mond ............... H01J 35/14  
                                              313/148

(Continued)

FOREIGN PATENT DOCUMENTS

DE       4021709 A1    1/1992  
JP       S58106858 U   7/1983  
(Continued)

*Primary Examiner* — Anastasia Midkiff

(57) ABSTRACT

A cathode for an X-ray tube, an X-ray tube, a system for X-ray imaging, and a method for an assembly of a cathode for an X-ray tube include a filament, a support structure, a body structure, and a filament frame structure. The filament is provided to emit electrons towards an anode in an electron emitting direction, and the filament at least partially includes a helical structure. Further, the filament is held by the support structure which is fixedly connected to the body structure. The filament frame structure is provided for electron-optical focusing of the emitted electrons, and the filament frame structure is provided adjacent to the outer boundaries of the filament. The filament frame structure includes frame surface portions arranged transverse to the emitting direction, and the filament frame structure is held by the support structure.

13 Claims, 14 Drawing Sheets

(51) Int. Cl.
- *H01J 37/06* (2006.01)
- *H01J 9/04* (2006.01)
- *H01J 1/18* (2006.01)
- *H01J 37/065* (2006.01)
- *H01J 1/92* (2006.01)
- *H01J 35/14* (2006.01)

(52) U.S. Cl.
CPC .......... *H01J 35/165* (2013.01); *H01J 37/065* (2013.01); *H01J 35/14* (2013.01); *H01J 2229/4824* (2013.01); *H01J 2229/4831* (2013.01); *H01J 2235/06* (2013.01); *H01J 2237/032* (2013.01); *H01J 2237/036* (2013.01); *H01J 2237/038* (2013.01); *H01J 2893/0006* (2013.01)

(58) Field of Classification Search
CPC ........ H01J 1/00; H01J 1/02; H01J 1/13; H01J 1/15; H01J 1/16; H01J 1/18; H01J 1/88; H01J 1/90; H01J 1/92; H01J 1/94; H01J 9/00; H01J 9/02; H01J 9/04; H01J 9/042; H01J 9/18; H01J 19/00; H01J 19/02; H01J 19/04; H01J 19/08; H01J 19/10; H01J 19/12; H01J 19/42; H01J 19/44; H01J 19/46; H01J 19/48; H01J 19/78; H01J 29/00; H01J 29/003; H01J 29/006; H01J 29/02; H01J 29/04; H01J 29/46; H01J 29/48; H01J 29/484; H01J 29/485; H01J 29/488; H01J 29/82; H01J 29/823; H01J 29/969; H01J 35/00; H01J 35/02; H01J 35/025; H01J 35/04; H01J 35/06; H01J 35/16; H01J 35/165; H01J 37/00; H01J 37/02; H01J 37/04; H01J 37/06; H01J 37/063; H01J 37/065; H01J 2201/00; H01J 2201/19; H01J 2203/00; H01J 2203/02; H01J 2209/00; H01J 2209/02; H01J 2209/18; H01J 2229/00; H01J 2229/0007; H01J 2229/0015; H01J 2229/003; H01J 2229/48; H01J 2229/4803; H01J 2229/4806; H01J 2229/4824; H01J 2229/4827; H01J 2229/4831; H01J 2229/4844; H01J 2229/484; H01J 2235/00; H01J 2235/02; H01J 2235/06; H01J 2237/00; H01J 2237/02; H01J 2237/03; H01J 2237/032; H01J 2237/036; H01J 2237/038; H01J 2237/06; H01J 2237/063; H01J 2237/06308; H01J 2237/06375; H01J 2893/00; H01J 2893/0001; H01J 2893/0002; H01J 2893/0005; H01J 2893/0006; H01J 2893/0008; H01J 2893/0012; H01J 2893/0015; H01J 2893/0017; H01J 2893/0022; H01J 2893/0025; H01J 2893/0048; H01J 2893/0049; H01J 2893/005; H01J 2893/0088; H01J 2893/0089; H01J 2893/0096

See application file for complete search history.

(56) References Cited

U.S. PATENT DOCUMENTS

| | | | | |
|---|---|---|---|---|
| 2,301,955 | A | * | 11/1942 | Krause .............. H01J 9/50 29/764 |
| 2,585,702 | A | * | 2/1952 | Thompson .............. H01J 49/16 250/281 |
| 2,671,867 | A | * | 3/1954 | Atlee .............. H01J 35/04 313/107 |
| 2,885,582 | A | * | 5/1959 | Bell .............. H05G 1/04 313/21 |
| 2,909,701 | A | * | 10/1959 | Okress .............. H01J 1/22 313/275 |
| 3,631,289 | A | * | 12/1971 | Perry .............. H01J 35/06 313/344 |
| 3,943,393 | A | * | 3/1976 | Naill .............. H01J 5/62 313/331 |
| 4,307,318 | A | * | 12/1981 | Nixon .............. H01K 1/18 313/315 |
| 5,438,605 | A | | 8/1995 | Burke et al. |
| 5,515,413 | A | | 5/1996 | Knudsen et al. |
| 5,526,396 | A | * | 6/1996 | Jacob .............. H01J 35/06 378/121 |
| 6,066,019 | A | | 5/2000 | Bewlay |
| 6,607,416 | B2 | | 12/2002 | Kautz et al. |
| 6,762,540 | B2 | | 4/2004 | Schaeffer et al. |
| 7,130,381 | B2 | | 10/2006 | Lovoi et al. |
| 7,668,296 | B2 | | 12/2008 | Schaeffer et al. |
| 2002/0187711 | A1 | * | 12/2002 | Kautz .............. H01J 35/06 445/28 |
| 2004/0091080 | A1 | * | 5/2004 | Garewal .............. H01J 35/30 378/119 |
| 2004/0192997 | A1 | | 9/2004 | Lovoi |
| 2010/0176708 | A1 | | 7/2010 | Hauttman |
| 2010/0195797 | A1 | | 8/2010 | Hauttman |
| 2010/0207508 | A1 | | 8/2010 | Terletska et al. |

FOREIGN PATENT DOCUMENTS

| | | |
|---|---|---|
| JP | 2001084933 A | 3/2001 |
| JP | 2006331853 A | 12/2006 |
| JP | 2007287501 A | 11/2007 |
| WO | 2007000971 A1 | 1/2007 |

* cited by examiner

CATHODE FILAMENT ASSEMBLY

CROSS-REFERENCE TO PRIOR APPLICATIONS

This application is the U.S. National Phase application under 35 U.S.C. § 371 of International Application Serial No. PCT/IB2013/054181, filed on May 21, 2013, which claims the benefit of U.S. Application Ser. No. 61/649,973, filed on May 22, 2012. These applications are hereby incorporated by reference herein.

FIELD OF THE INVENTION

The present invention relates to a cathode for an X-ray tube, an X-ray tube, a system for X-ray imaging, and a method for an assembly of a cathode for an X-ray tube.

BACKGROUND OF THE INVENTION

For the generation of X-ray radiation, for example in an X-ray tube, a filament is provided for emitting electrons to impinge on a surface, thereby generating X-ray radiation. In order to provide a focal spot, the exact arrangement of the filament and its positioning is required. Alterations of the filament during operation may lead to a change of the focal spot and thus to a change of the radiated X-ray beam, for example. Therefore, care is taken for a correct positioning of the filament during assembly. For example, during a cathode cup assembly, the required filament shape and also the position of the filament in relation to the cathode head takes place with a predefined accuracy. This is achieved, for example, by manual adjustment. U.S. Pat. No. 6,607,416 B2 describes a fixture for using a mandril to set a filament on an electrode for mounting the filament on a cathode head. However, it has been shown that the securing of the filament ends in the cavities of the cathode may still require final position relating to the direction of the emitted electrons. Further, also the correct alignment of the mounting tool in relation to the cathode cup for properly positioning the filament in the first place has to be carefully observed.

SUMMARY OF THE INVENTION

Thus, there may be a need to provide a cathode with an improved and facilitated assembly with increased precision of the positioning.

The object of the present invention is solved by the subject-matter of the independent claims, wherein further embodiments are incorporated in the dependent claims.

It should be noted that the following described aspects of the invention apply also for the cathode for an X-ray tube, the X-ray tube, the system for X-ray imaging, and the method for an assembly of a cathode for an X-ray tube.

According to a first aspect of the present invention, a cathode for an X-ray tube is provided, comprising a filament, a support structure, a body structure and a filament frame structure. The filament is provided to emit electrons towards an anode in an electron emitting direction, wherein the filament at least partially comprises a helical structure. The filament is held by the support structure, which is fixedly connected to the body structure. The filament frame structure is provided for electron-optical focusing of the emitted electrons. The filament frame structure is provided adjacent to the outer boundaries of the filament. The filament frame structure further comprises frame surface portions arranged transverse to the emitting direction. The filament frame structure is held by the support structure.

The term "electron emitting direction" relates to the main direction of electrons as defined by a line connecting a central portion of the filament with a central portion of a focal spot on the anode.

For example, the filament is totally recrystallized, i.e. the filament is in a status of total recrystallization. For a recrystallization, the filament may be exposed to externally applied heat, e.g. in an oven or furnace. As an example for applying heat, an enclosing of the filament is provided, which structure is heated up by induction. For example, the inducted structure is provided underneath a bell-shaped cap or cover. The total recrystallization is thus not provided by an electric current applied to the two ends of the cathode to generate heat from inside, but rather by heat from outside of the filament.

According to an exemplary embodiment, the filament is a straight end helical filament. The connecting ends of the winding are aligned to a longitudinal direction around which the helical winding of the filament is provided. Thus, any change in the length of the connecting ends is avoided.

The filament frame structure is provided as a focusing device for the electrons. The frame surface portions may be provided as flat portions arranged perpendicular to the emitting direction, or in slightly deviated directions, such as +/−10° of the perpendicular direction.

The filament frame structure is divided into a first and a second electrically separate part, wherein the first part is assigned to a first electrical connection potential, and the second part is assigned to a second electrical connection potential.

For example, the first part is connected to an electrical potential applied to a first end of the filament, and the second part is connected to an electrical potential applied at the other end of the filament.

According to an exemplary embodiment, the filament frame structure comprises at least one positioning device for at least one positioning direction of the filament in relation with the body structure.

Thus, the correct positioning of the filament is facilitated. For example, by holding of the filament structure by the support structure, the support structure defines a position of the filament in respect of the electron emitting direction via the filament frame structure. The filament frame structure may comprise a longitudinal groove for defining a linear direction of the filament. The filament frame structure may also comprise a positioning device for two directions.

According to an exemplary embodiment, fitting members for receiving parts of a filament support arrangement are provided at the support structure and/or the filament frame support.

The filament frame structure may be provided during the mounting and assembly process, but is removed at least before normal operation to generate X-ray radiation in an X-ray tube.

According to an exemplary embodiment, the filament frame structure and/or the support structure comprise a reception for receiving two ends of a straight filament mounting-pin, which is provided during the mounting of the filament, and which pin is insertable within the filament's coil opening for correct placing of the filament.

According to a further exemplary embodiment, the body structure is provided as a cathode cup. The cathode cup is provided as a ceramic cathode cup made from electrically non-conducting ceramic. A part of the cathode cup's surfaces is provided with a metallic coating.

The term "non-conducting" means electrically insolating. The metallic coating is also referred to as a metalized surface. The metallic coating is provided for electric conducting purposes, and for brazing purposes. For example, the cathode cup is made from aluminium oxide ($Al_2O_3$). The cathode may also be made from aluminium nitrate (AlN).

According to an exemplary embodiment, the cathode cup is provided with a flat front side, wherein the filament is arranged on the flat front side.

According to a second aspect of the present invention, an X-ray tube is provided, comprising a cathode and an anode. The cathode is provided as a cathode according to one of the above mentioned examples.

According to a third aspect of the present invention, a system for X-ray imaging is provided, comprising an X-ray source, an X-ray detector, and a processing unit. The processing unit is configured to control the X-ray source and the X-ray detector for providing X-ray image data of an object of interest. The X-ray source is provided with an X-ray tube as described and discussed above.

The X-ray system may be a medical imaging system.

According to a further example, an inspection apparatus is provided as the X-ray system, for example for scanning and screening of luggage or transportation pieces, or for material and construction inspection purposes.

According to a fourth aspect of the present invention, a method for an assembly of a cathode for an X-ray tube is provided, the method comprising the following steps:
a) providing a filament, wherein the filament is configured to emit electrons towards an anode in an electron emitting direction, and wherein the filament at least partially comprises a helical structure;
b) aligning the filament with respect to a filament frame structure, wherein the filament frame structure is configured for electron-optical focussing of the emitted electrons, wherein the filament frame structure is provided adjacent to the outer boundaries of the filament, and wherein the filament frame structure comprises frame surface portions arranged transverse to the emitting direction;
c) connecting the filament to the filament frame structure;
d) connecting a support structure to a body structure;
e) placing the filament frame structure on the support structure; and
f) connecting the filament frame structure and the filament to the support structure.

The filament frame structure may be connected to the body structure, in addition, or instead of being connected to the support structure, for example in case of a ceramic cathode head.

The connection of the support structure to the body structure may be provided before one of the above mentioned steps a) to c), but before step e).

According to an exemplary embodiment, a support guide is provided for the assembly, and the steps are provided as:
a1) providing the filament on the support guide;
b1) aligning the support guide with respect to the filament frame structure, wherein the support guide is removed: i) after the filament is connected to the filament frame structure; or ii) after the filament frame structure is connected to the support structure.

According to a further exemplary embodiment, following step a), but before the placing of step e), a total recrystallizing of the filament is provided by applying external heat. For example, the heat is not generated by applying an electric current to the two ends of the filament, but rather from the outside, for example in an oven or furnace.

According to an aspect of the present invention, by fixing both the filament and the filament frame structure to the support structure, the correct alignment of the respective parts relating to the desired electron emitting direction is facilitated. Further, due to providing a support structure, which is then mounted or fixedly connected to the body structure, connecting possibilities for a facilitated fixation procedure for the respective parts, i.e. the filament and the filament frame structure, is provided. Thus, the fixedly connection of the support structure to the body structure can be provided separately, wherein it must be noted that in particular the fixation to the body structure may lead to deviations in the alignment. However, since according to an example, the filament is connected with the support structure, and not directly to the body structure, the alignment of the filament itself enables a compensation of the "misalignment" of the support structure. For example, in case of height-deviation, i.e. a support structure not being inserted far enough into the body structure, the support structure can be machined in a rather simple way to achieve correct alignment of the height of the support structure. When placing the filament onto the support structure, for the purpose of connecting the filament to the support structure, a respective alignment in relation to the body structure is facilitated.

According to a further aspect, the filament frame structure, provided for the electron-optical steering, is also applicable for providing a correct positioning of the filament. For example, the filament is temporarily held by the filament frame structure, the latter thus acting as a so-to-speak holding device, facilitating the handling of the filament during the assembly. According to a further example, the filament itself is stabilized during the assembly, which reduces the requirements for the handling of the filament during the mounting steps. Further, the mounting support arrangement for the filament can also be used for a correct alignment and a proper positioning of the filament in relation to the body structure of the cathode.

According to a further aspect of the invention, a partially integrated tooling in form of the filament frame structure is provided, leading to less inter-phases, which facilitates the mounting procedure and by which also a higher accuracy can be achieved, for example also because of much less deformation in case of a totally recrystallized filament. Thus, less effort during the assembly procedure is provided. For example, no manual adjustment is needed. In case of a totally recrystallized filament, no further flashing is necessary. The term "flashing" refers to an application of a high current in order to let the filament glow for a predetermined short period of time. Thus, flashing provides a thermal treatment with the purpose of stabilizing the filament. A totally recrystallized filament will have reduced plastic deformation over lifetime and an improved lifetime distribution by a reduction of failure molds.

According to a further aspect, the filament frame structure also enables a simplified ceramic structure with a reduced number of parts and assembly steps. A simplified ceramic structure, for example, has potential for enhanced thermal performance of the cathode.

According to a further aspect, no plasticity for adjustment is needed during the assembly. Therefore, the support of the filament can be directly brazed, for example, to the cathode with potentially higher thermal and mechanical loadability of the cathode by increased stability and less thermal drift with shorter elements and more direct connections.

According to a further aspect, because the filament frame structure is held by the support structure, and the filament itself is connected to the support structure, the filament frame structure moves together with the filament, reducing thermal drift effects significantly.

These and other aspects of the present invention will become apparent from and be elucidated with reference to the embodiments described hereinafter.

BRIEF DESCRIPTION OF THE DRAWINGS

Exemplary embodiments of the invention will be described in the following with reference to the following drawings:

FIG. 5 shows a further example of a cathode according to the present invention, wherein FIG. 5B shows a further side view of a support structure, and wherein

FIG. 12 shows an example for a system for X-ray imaging according to the present invention, wherein

DETAILED DESCRIPTION OF EMBODIMENTS

Figure 1A:
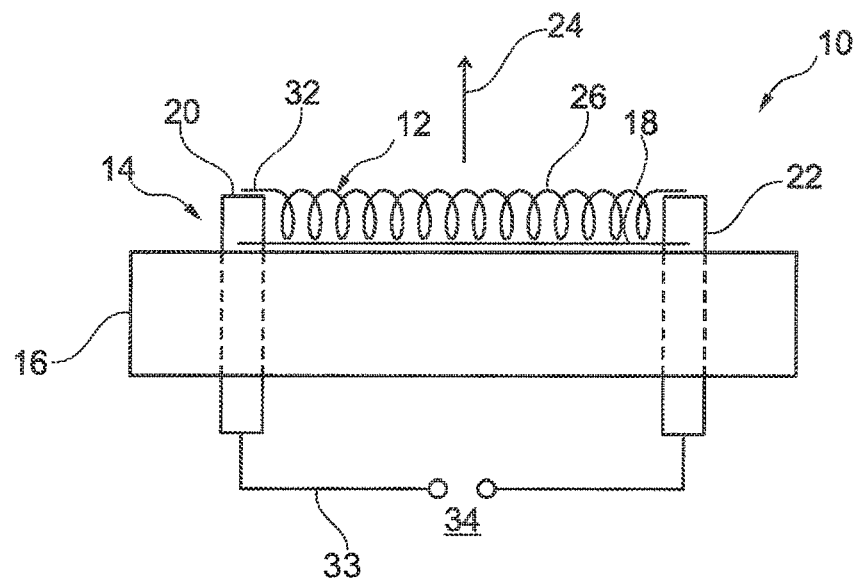
FIG. 1 schematically shows an example for a cathode for an X-ray tube according to the present invention in a side view showing the longitudinal extension in FIG. 1A and in a top view in FIG. 1B.

FIG. 1A shows a side view, or elevation view of a cathode 10 for an X-ray tube. The cathode 10 comprises a filament 12, a support structure 14, a body structure 16, and a filament frame structure 18. For example, the support structure 14 comprises a first mounting bolt 20 and a second bolt 22.

Figure 1B:
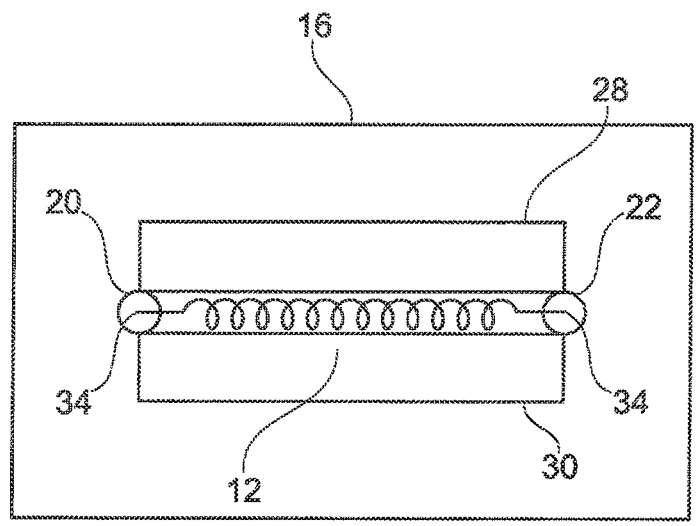

The filament 12 is provided to emit electrons towards an anode (not shown) in an electron emitting direction 24. The filament 12 at least partially comprises a helical structure 26. The filament 12 is held by the support structure 14, which is fixedly connected to the body structure 16. The filament frame structure 18 is provided for electron-optical focusing of the emitted electrons. The filament frame structure is provided adjacent to the outer boundaries of the filament 12, which is also shown in FIG. 1B showing the cathode 10 of FIG. 1A in a top view. The filament frame structure 18 comprises frame surface portions 28 and 30 arranged transverse to the emitting direction 24. The filament frame structure 18 is held by the support structure 14.

In FIG. 1A, a connection 33 of the support structure 14 to an electrical source 34 is schematically indicated. For example, the mounting bolts extending through the body structure 16 can have a respective connection at the side opposite to the side where the filament 12 is arranged. The electrical source provides the electrical potential to the filament 12 (not further shown).

According to a further example, the filament 12 is a straight end helical filament, wherein the connecting ends 32 of the filament are aligned to a longitudinal direction around which the helical winding of the filament 12 is provided.

It must be noted that although FIGS. 1A and 1B show the filament as a straight end helical filament, the filament of FIGS. 1A and 1B may also be provided with differently arranged ends, i.e. in another form as a straight end helical filament as shown. This is also the case for the further figures.

Figure 2A:
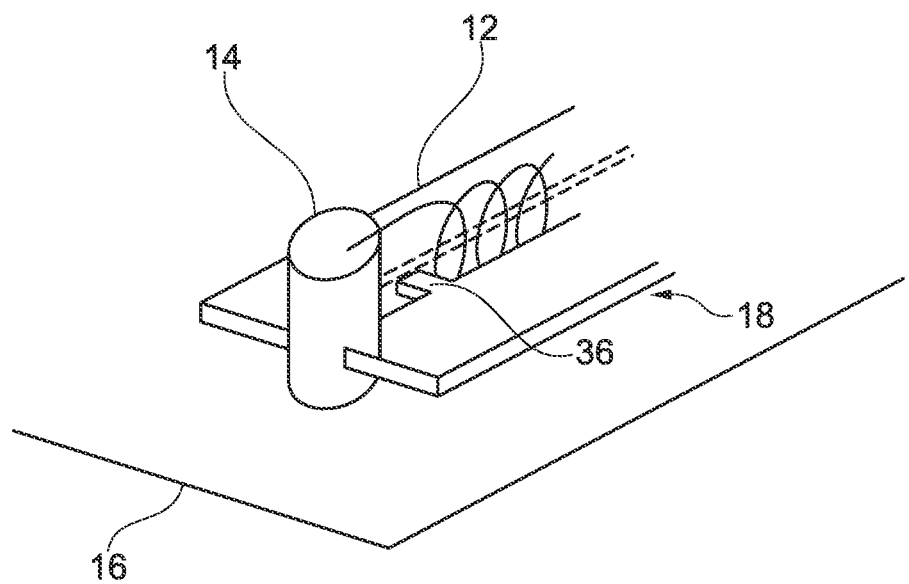
FIG. 2 shows a portion of a further example of a cathode according to the present invention in a perspective view in FIG. 2A and in a top view in FIG. 2B.
Figure 2B:
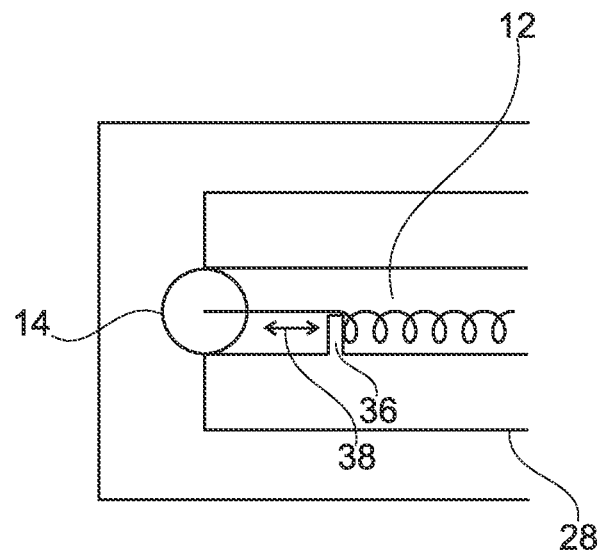

As shown in FIG. 2A in a perspective view, and in FIG. 2B in a top view, the filament frame structure 18 may comprise at least one positioning device 36 for at least one positioning direction 38, indicated in FIG. 2B with a double arrow, of the filament 12 in relation with the body structure 16. As an example, a small leash is provided at the inner side of one of the surface portions, for example the portion 28, thus providing an abutting or stopping piece of the frame portion in order to properly position the filament 12. For example, the protruding leash can be removed or bent away once the filament 12 is fixedly connected to the support structure 14.

Figure 3:
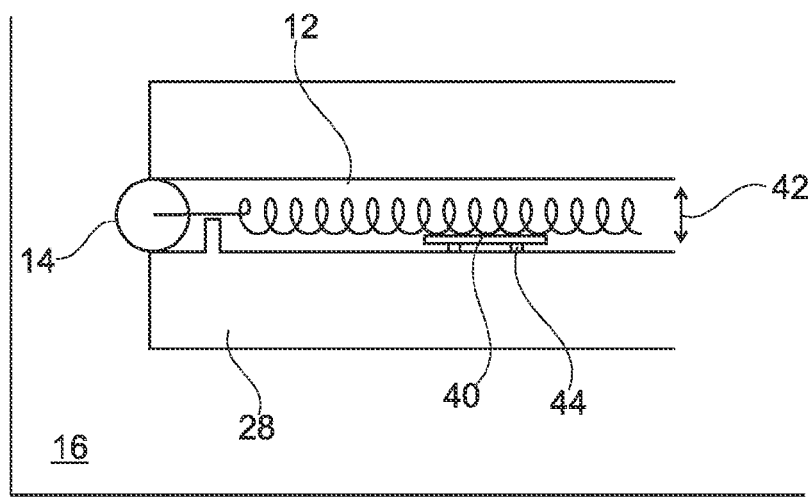
FIG. 3 shows a portion of a further example of a cathode for an X-ray tube according to the present invention.

As shown in FIG. 3 in a top view, at least a second positioning device 40 for a second positioning direction 42, indicated in FIG. 3 with a double arrow, of the filament 12 in relation with the body structure 16 can be provided. For example, a segment is provided at an inner side of one of the surface portions, for example portion 28, providing a longitudinal abutting surface for the proper alignment of the filament 12. As indicated with two little bars 44, the second positioning device may be removed, i.e. cut away or bent, away after the fixation of the filament 12 to the support structure 14.

Of course, also other positioning means, i.e. other forms of abutting surfaces in one of the described directions can be provided, or also in a further direction, for example perpendicular to the second direction 42 and perpendicular to the longitudinal direction of the filament 12, for providing respective abutting or resting surfaces for the alignment of the filament 12. In other words, the positioning device provides a mechanical stop for abutting the filament's coil wounding in at least one direction, for example the linear direction of the filament.

Figure 4:
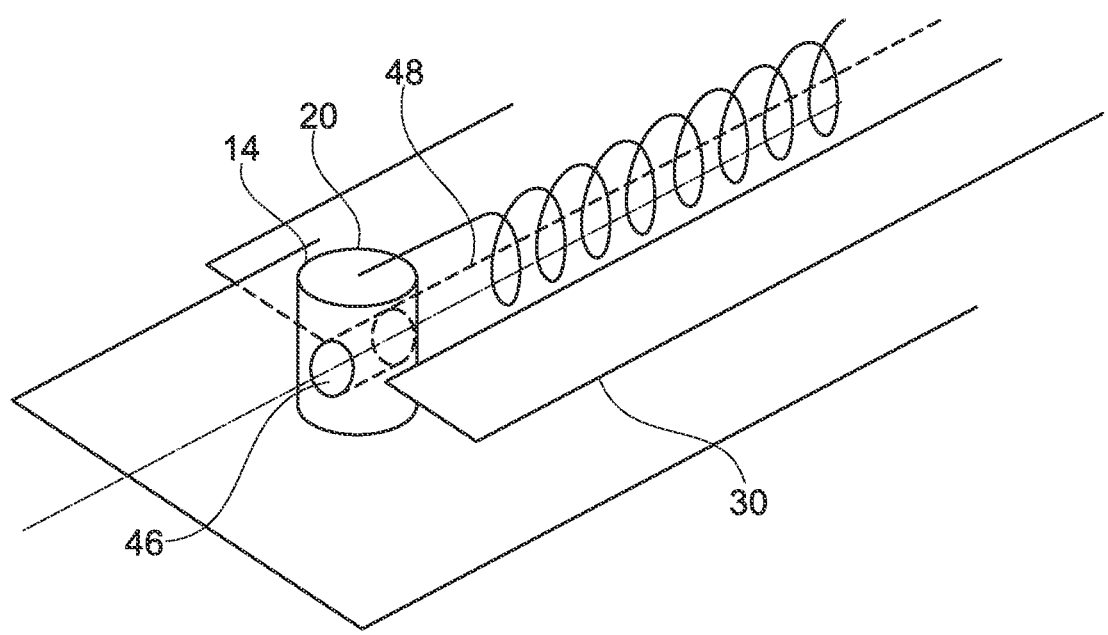
FIG. 4 shows a further example of a cathode according to the present invention in a perspective view.

As shown in FIG. 4, according to a further example, fitting members 46 for receiving parts of a filament support arrangement, indicated in FIG. 4 with two dotted lines 48, are provided at the support structure 14. For example, the fitting members 46 are provided as through-holes through the mounting bolt 20, or 22, such that a straight filament mounting-pin 50 (shown in FIG. 6 et seq.), can be provided for the assembly and later removed.

According to a further example (not further shown), the respective fitting members for receiving parts of a filament support arrangement are provided at the filament frame support alternatively or in addition to the fitting members for receiving parts of a filament support arrangement at the support structure.

Figure 5A:
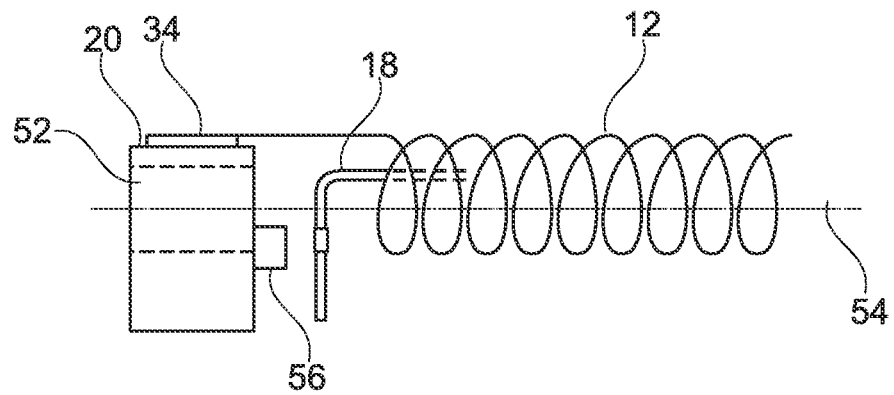
FIG. 5A shows a side view of a support structure and a filament.
Figure 5B:
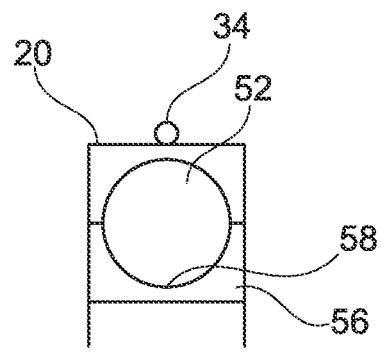

For example, as indicated in relation with FIG. 4, the support structure 14 comprises a reception 52, as also shown in FIGS. 5A and 5B, for receiving two ends of the straight filament mounting-pin 50, which is provided during the mounting of the filament, and which pin is insertable within the filament's coil opening for correct placing of the filament, and also for holding and supporting the filament 12.

FIG. 5A shows the mounting bolt 20 with the through-hole of the reception 52 and the filament 12. Further, a dotted line 54 indicates the longitudinal direction of the filament 12. Still further, the filament frame structure 18 is only indicated.

Further, on an inner side of the mounting bolt 20, a first resting protrusion 56 is provided, which is also shown in FIG. 5B showing a view perpendicular to the view of FIG. 5A, viewing towards the mounting bolt 20. The protrusion 56 is provided with an adapted inner rounded surface 58, such that it is conforming to the through-hole of the reception 52. Thus, when mounting the filament 12, a support in form of the straight filament mounting-pin 50 can be inserted from above to be resting on the protrusion 56. Upon fixing the filament's end 34 to the mounting bolt 20, the straight filament mounting-pin 50 (not shown in FIG. 5A) can be pulled out to the left side for example, through the reception 52 of the final assembly and fixation of the filament.

Figure 5C:
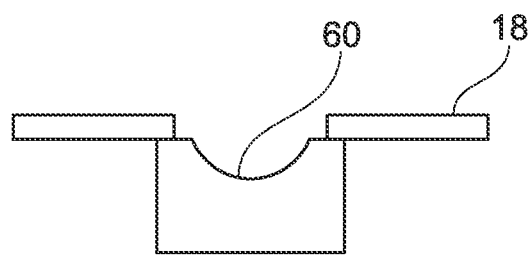
FIG. 5C shows a further side view in the longitudinal direction of a filament frame structure.

As shown in FIG. 5C, also the filament frame structure 18 may be provided with a reception 60 for receiving the mounting-pin 50. Thus, it is possible to provide the mounting-pin 50 for supporting the filament 12, and to rest the mounting-pin 50 on the frame structure. Thus, for the assembly, the filament frame structure 18 acts as a mounting tool. The mounting-pin 50 together with the filament 12 and the filament frame structure 18 can thus be positioned together such that the filament 12 is properly aligned.

Figure 5D:
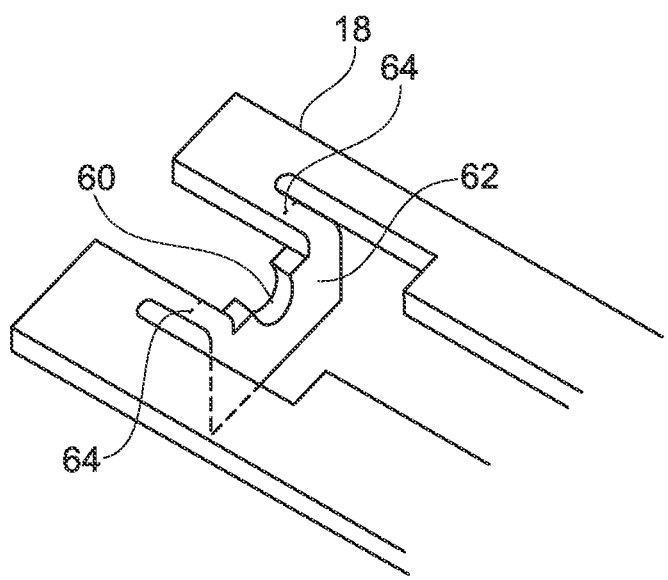
FIG. 5D shows the frame structure in a perspective view.

For example, the receiving reception 60 of the filament frame structure 18 can be provided by a bended portion 62, as shown in FIG. 5D. Further, it is also possible to remove the respective portion of the frame structure once the frame structure 18 is connected to the support structure 14 and the mounting-pin 50 is removed. For example, the small leashes connecting the bended portion 62 to the other portions of the filament frame structure can be cut away, as indicated with dotted lines 64.

According to a further example (not shown), the pin may also be provided with a different shape resulting in, for example, a curved filament, instead of a straight and linear element for the pin.

According to a further example (also not shown), instead of a pin, also other measurements can be provided, for example a support arrangement comprising several parts.

The frame surface portions and the filament centre line may be arranged in a common layer.

The support structure 14 comprises support pins, for example the mounting bolt, brazed to the body structure. The support pins, for example the mounting bolts, may be machined accurately by electron discharge machining (EDM) after being brazed.

According to a further example, the support structure may be made integrally with a body structure, wherein the filament frame structure is brazed to the body structure representing the support structure.

Figure 6:
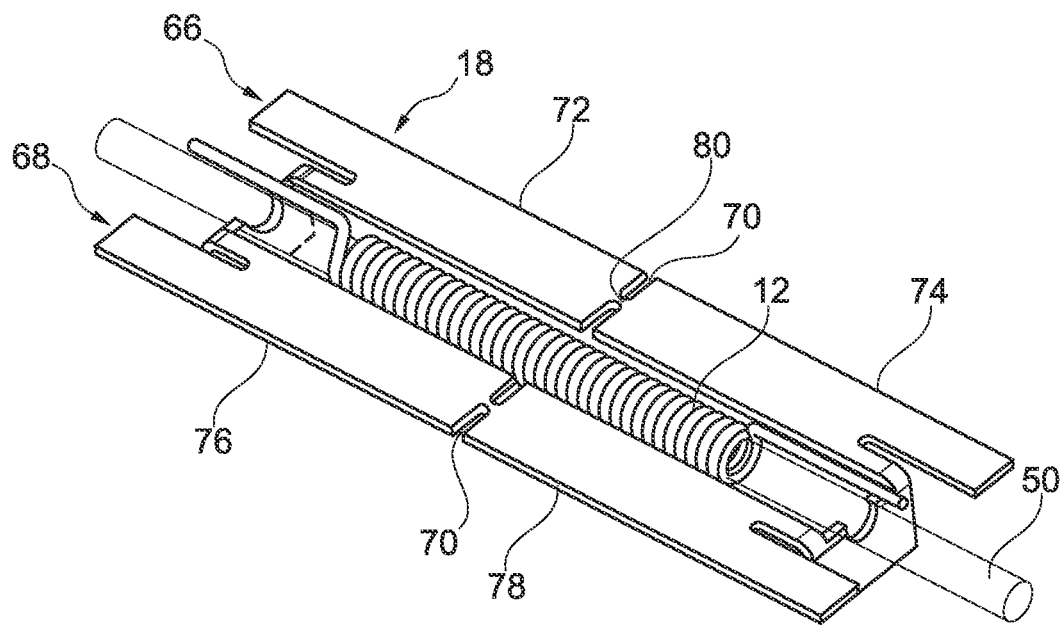
FIG. 6 shows an example of a filament in relation with a filament frame structure according to the present invention.

FIG. 6 shows the filament frame structure 18 together with the mounting-pin 50 and the filament 12. As can be seen, the filament frame structure 18 comprises two longitudinal frame surface portions 66 and 68 on either side of the filament 12. On each side, a small gap 70 is provided, thus separating the respective frame surface portions into two sub-portions, resulting in a first sub-portion 72 and a second sub-portion 74 for the side 66, and a third sub-portion 76 and a fourth sub-portion 78 for the opposite side 68.

The respective sub-portions on one side are thus only connected by a small bar 80. Thus, it is possible to provide a one-piece filament frame structure 18 facilitating the mounting and handling procedure. However, after mounting and connecting the respective parts, i.e. the filament 12 and the frame structure to the support structure 14 (not shown in FIG. 6), the bars 80 can be removed.

Figure 7A:
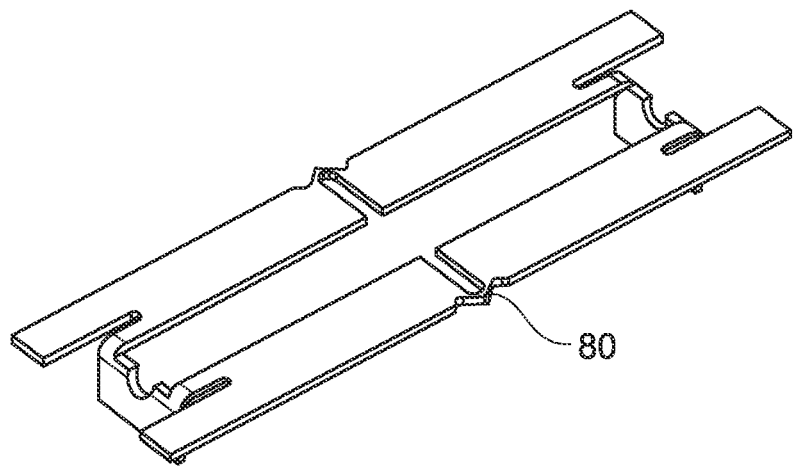
FIG. 7 shows a further example of a filament frame structure according to the present invention in a perspective view in FIG. 7A and in a top view in FIG. 7B.
Figure 7B:
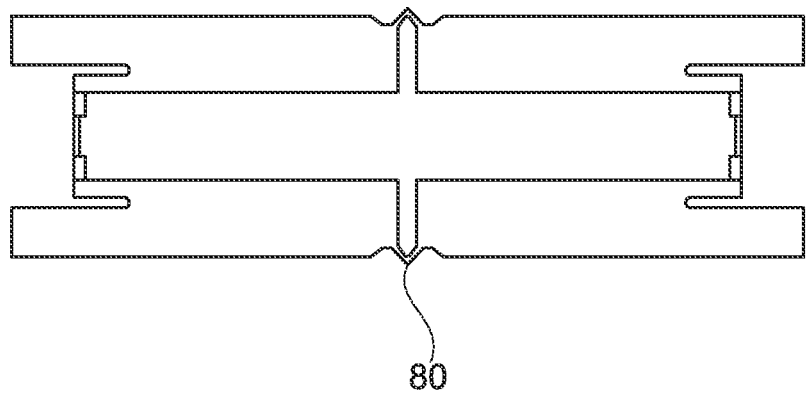

As FIG. 6 shows the bars in a middle portion, the bars 80 can also be provided on the side portion, as shown in FIG. 7A in a perspective view showing the frame only, and the respective top view in FIG. 7B.

It must be noted that FIG. 6, and also FIGS. 7A and 7B, show the filament frame structure 18 with end portions bended outwardly, for example to rest on the outer sides of the mounting bolts 20, 22, whereas FIG. 5D shows an inwardly bended portion for providing a respective support reception for the mounting-pin 50. However, the provision of the gaps 70 and the bars 80 may also be provided for the inwardly bended version of FIG. 5D.

It is further noted that FIG. 6 shows the mounting-pin 50 holding the filament 12 for the handling procedure.

Figure 8:
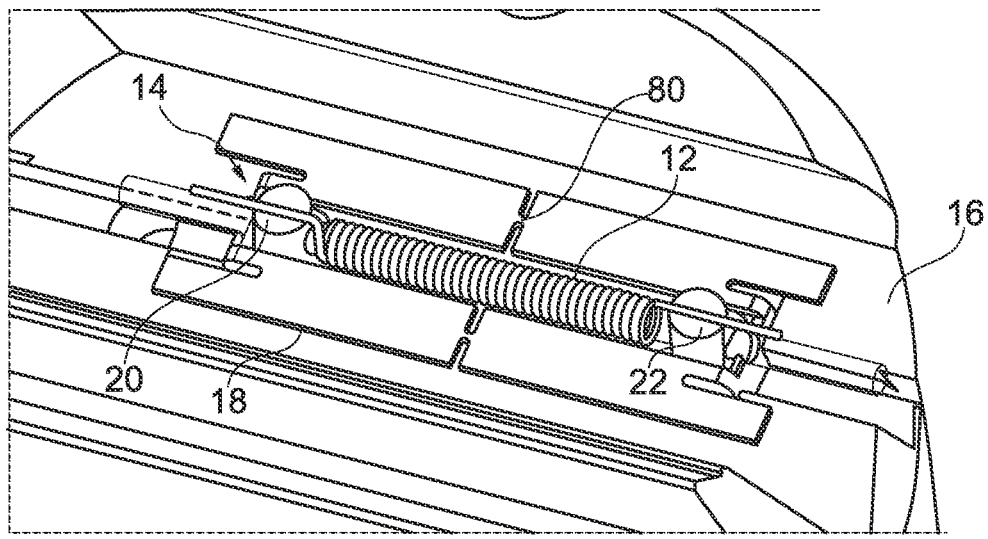
FIG. 8 shows an example of a cathode for an X-ray tube according to the present invention in a perspective view.

FIG. 8 shows a perspective view of the filament aligned with the support structure 14. For example, the mounting bolts are provided with a longitudinal groove for facilitating the proper positioning of the filament 12. After connecting the filament frame structure 18 to the support structure 14, the bars 80 shown in FIG. 8 are removed, which is shown in FIG. 9.

Figure 9:
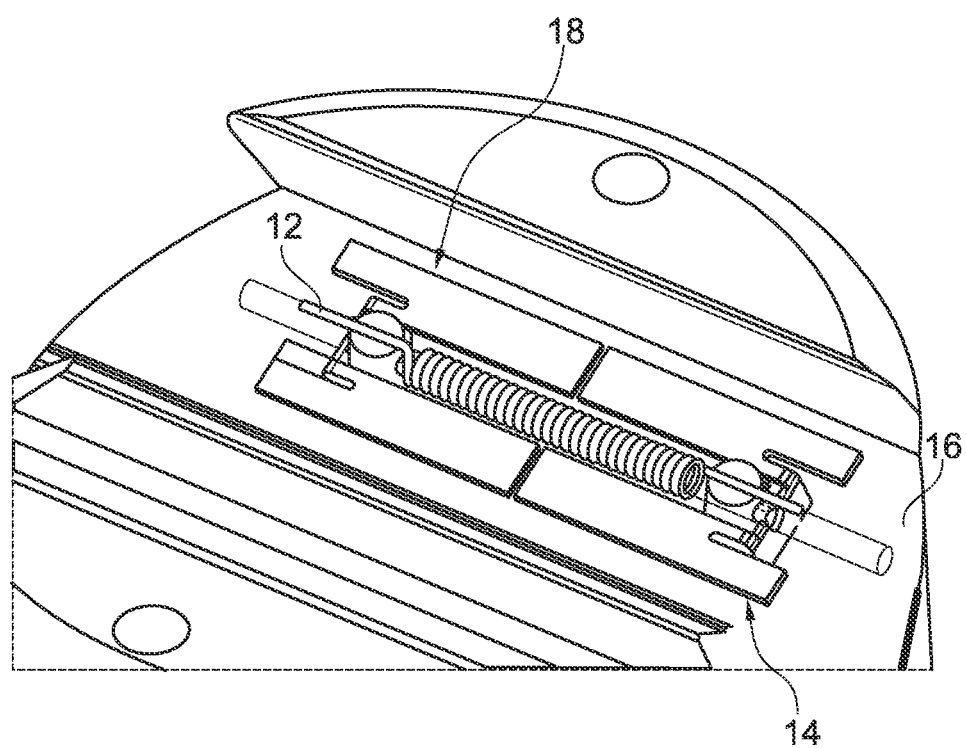
FIG. 9 shows the cathode of FIG. 8 in a further state after the mounting procedure.

It is further noted that FIG. 8 shows the body structure 16 as a cathode with a surface profile, whereas FIG. 9 shows the body structure 16 with a flat surface in the area of the filament 12 and the filament frame structure 18.

Figure 10:
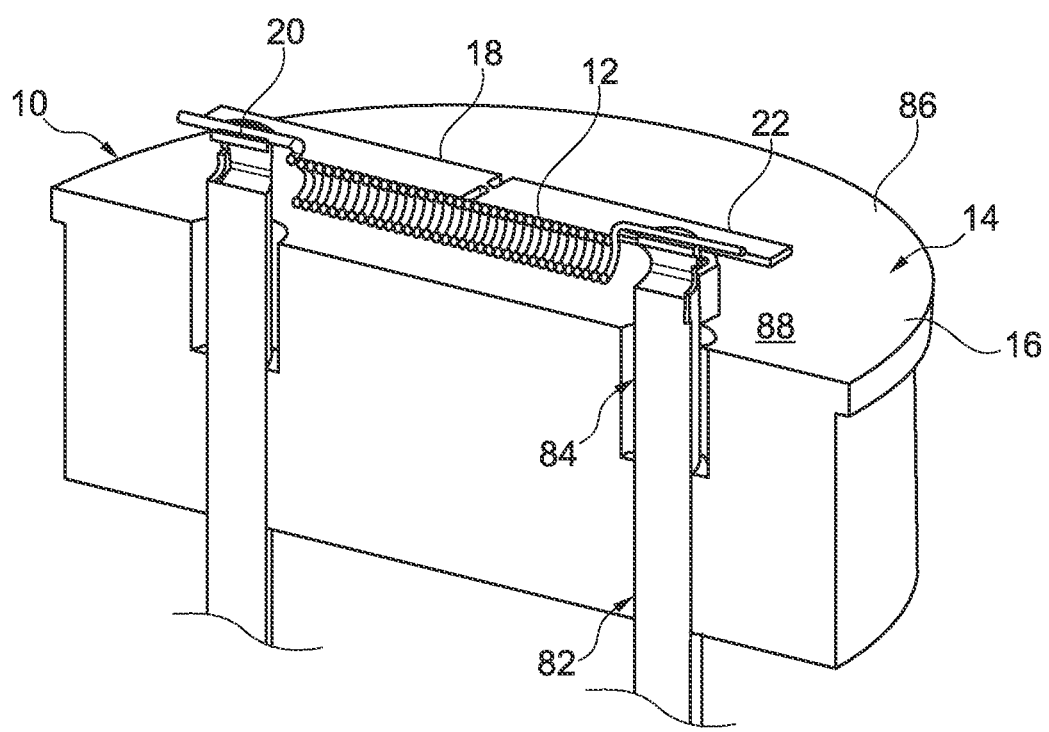
FIG. 10 shows a further example of a cathode for an X-ray tube in a perspective cross-section.

FIG. 10 shows a cross-section of a further example of the present invention. As can be seen, the filament 12 is connected to the mounting bolts 20, 22 of the support structure 14 and the filament frame structure 18 is also connected and thus held by the support structure 14. Further, the mounting bolts of the support structure 14 are extending through the body structure 16. Therefore, a stepped through-hole 82 is provided with an upper portion 84 having a larger diameter than the lower portion. Thus, the brazing, e.g., high temperature soldering, to the body structure 16 can be provided in the lower part, whereas at the upper part, the bolts are not coupled to the body structure 16, resulting in independent thermal expansion, thus supporting the proper alignment of the filament 12.

As can be seen, the connecting of the filament 12 and the connecting of the filament frame structure 18 to the same support structure 14 allows an independent movement during the operation, for example due to a thermal expansion. Thus, a proper alignment in respect of the electron-optical focusing is provided throughout the operation.

As also indicated above, according to a further example, the cathode 10 is provided with a cathode cup 86 as having a flat front side 88, wherein the filament 12 is arranged on the flat front side 88, as shown in FIG. 10 as an example.

It must be noted that the feature of the cathode cup having a flat front side may in particular be combined with the features shown in FIGS. 1 to 9. According to an example of the present invention, the filament 12 is totally recrystallized inside to achieve required straightness. For example, the filament 12 is made of W or high temperature ceramics such as BN and the like. The pin may be provided inserted into the helical structure during the recrystallization.

Further, the guiding pin 80 may also have a groove to fix the straight ends of the filament in a plane while the recrystallization process is conducted.

By attaching the filament frame structure to the support structure, together with the filament also being attached to the support structure, high accuracy stability is provided during the assembly. Thus, no manual or other adjustment and tooling is necessary. Further, high focal spot stability is provided over lifetime, with smaller drift effect from thermal expansions since both parts, i.e. the filament and the filament frame structure so-to-speak move together with each other.

Further, radiation cooling at temperatures with high infrared radiation is provided by the flat surface portions of the filament frame structure, but below thermionic emission level.

The filament frame structure can be attached in one piece and, for example, laser-cut after assembly, in order to separate electrical potentials. Thus, one piece or multi-piece frames are possible. Further, the isolation of the frame or counter parts may also be facilitated.

According to a further example (not further shown), the filament frame structure may be provided on a mounting support for the frame structure parts, thus a laser cutting process is not necessary after the assembly. However, an additional tool would be necessary for the mounting of the frame parts.

According to a further example, the filament is provided with a pretension in a non-operating state, for example provided by the support structure 14. For example, during the mounting, the pretension can be provided by the filament frame structure being a one piece component. The pretension while mounting is provided, for example to compensate thermal expansion of the filament, e.g. the coil, due to heating during operation. The pretension is adjusted to minimize mechanical stresses in operation, reducing plastic deformation and distortion of the filament 12. Thus, thermal mechanical and electron-optic stability is improved. As mentioned above, the pretension can be applied by the filament frame structure, or also by an additional tool.

With reference to FIGS. 7A and 7B, the pretension may also be applied by a controlled deformation of the support bars 80, after the filament welding, the curved bars are to be compressed by a tool, resulting in longitudinal stretching of frames. The bars are then, as mentioned above, laser-cut after assembly, to separate electrical potentials.

With reference to FIGS. 8, 9, and 10, according to an example, the body structure 16 is provided as a cathode cup, for example the cathode cup 86. The cathode cup is provided as a ceramic cathode cup, made from electrically non-conducting ceramic. A part of the cathode cup's surfaces is provided with a metallic coating.

For example, the metallization is provided on the surfaces for brazing and electrical purposes, e.g. to avoid surface charges.

Figure 11:
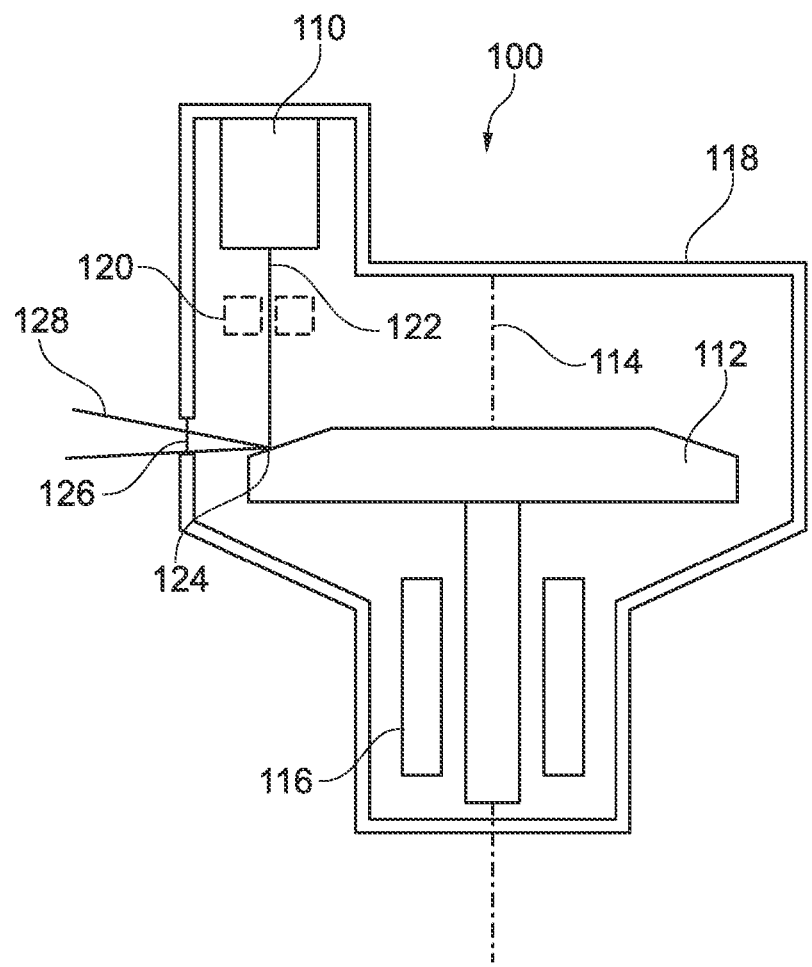
FIG. 11 shows an example of an X-ray tube according to the present invention in a cross-section.

FIG. 11 shows an X-ray tube 100 comprising a cathode 110, and an anode 112. The cathode is provided as a cathode according to one of the above mentioned and described examples.

For example, the X-ray tube is provided with a rotating anode, indicated with a rotation axis 114. For this purpose, driving device 116 are indicated, whereas only the parts inside a tube housing 118 are shown, neglecting any parts being outside, for example a scatter of the driving means.

Further, steering or deflection means device 120 is shown for deflecting an electron beam 122 from the cathode 110 towards a focal spot portion 124 on the anode 112. An X-ray transparent window 126 is shown such that an X-ray beam 128 is radiated towards a not further shown object. It must be noted that FIG. 12A is a schematic drawing of an X-ray tube.

Further, according to the present invention, also a system 200 for X-ray imaging is provided, comprising an X-ray source 210, and X-ray detector 212, and a processing unit 214. The processing unit 214 is configured to control the X-ray source 210 and the X-ray detector 212 for providing X-ray image data of an object of interest 216. The X-ray source 210 is provided as an X-ray tube 100 according to the above mentioned example.

Figure 12A:
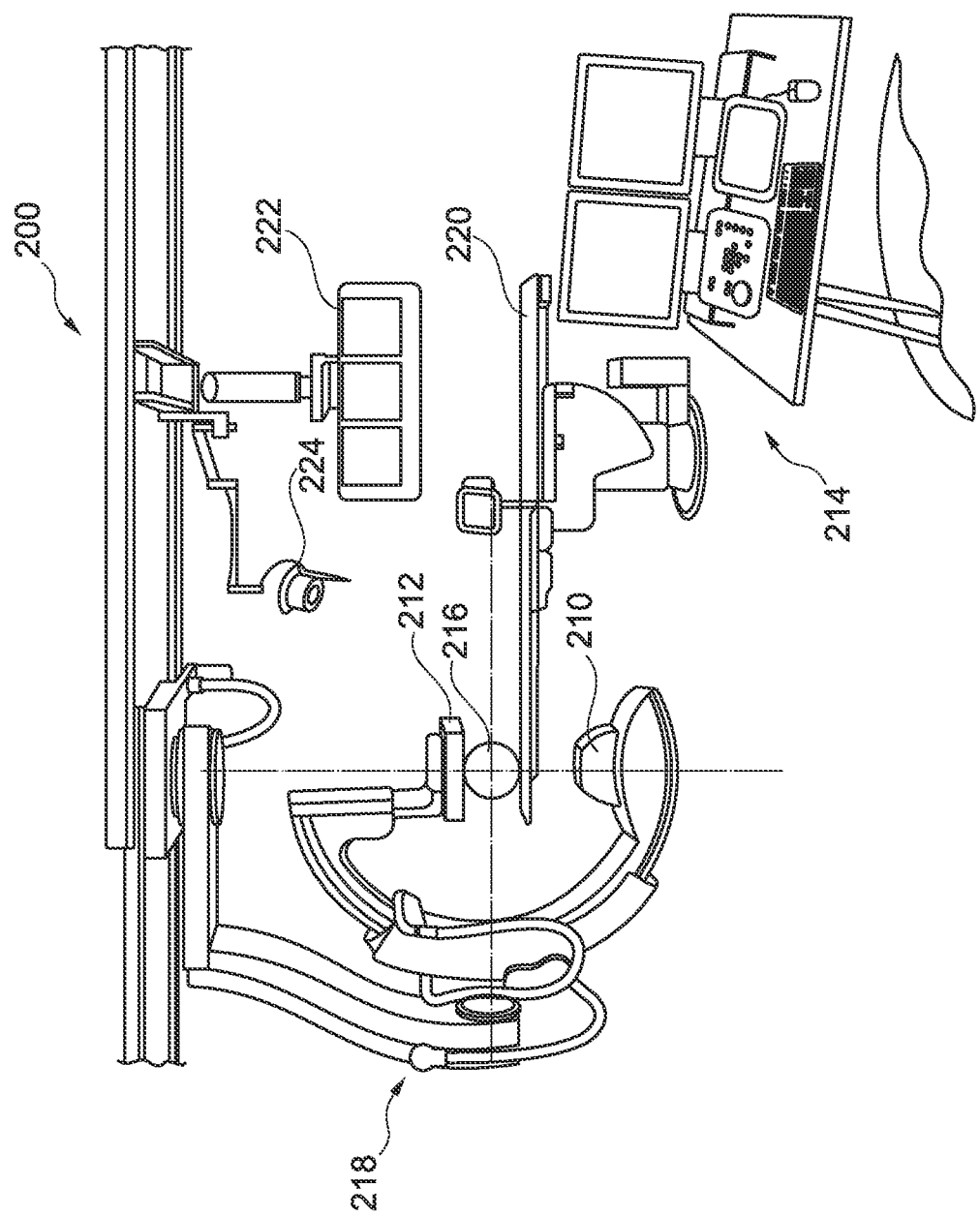
FIG. 12A shows a medical imaging system and FIG. 12B shows an inspection apparatus, for example for scanning and screening of luggage pieces.

For example, the X-ray system may be a medical imaging system as shown in FIG. 12A. As can be seen, the X-ray source 210 and the X-ray detector 212 are provided as a so-called C-arm arrangement 218, where a C-arm structure is movably mounted to a support arrangement in order to provide free arrangement of the source and detector around the object of interest. For example, a patient table 220 as well as monitoring devices 222 and lighting devices 224 are shown indicating an operational room in a hospital, for example.

Figure 12B:
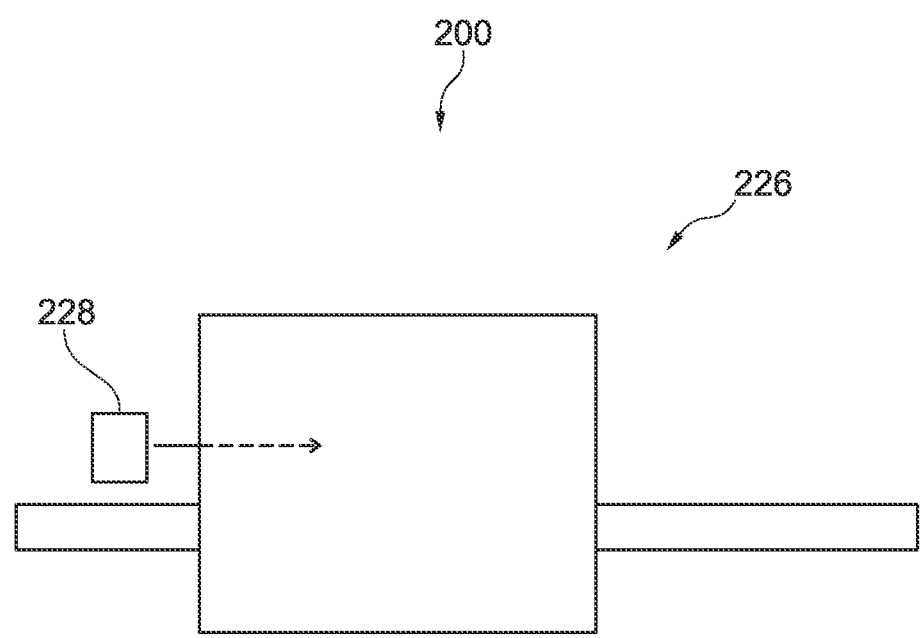

However, according to the present invention also an inspection apparatus 226 is provided, for example for scanning and screening of luggage pieces 228, or for material and construction inspection. This is shown in FIG. 12B as a further example for an X-ray system 200 for X-ray imaging, comprising an X-ray source which is provided as an X-ray tube according to the above mentioned examples. It is noted that the X-ray source is not further shown in FIG. 12B.

Figure 13:
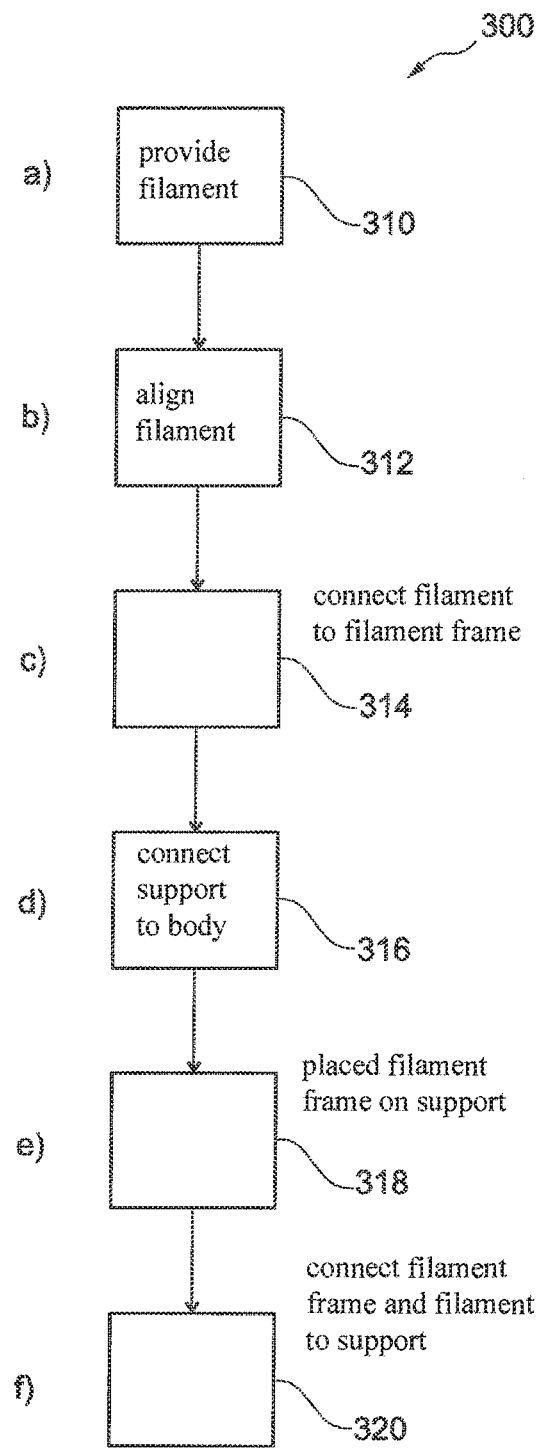
FIG. 13 shows basic steps of a method according to the present invention.

FIG. 13 shows a method 300 for an assembly of a cathode for an X-ray tube, comprising the following steps. In a first step 310, a filament is provided, wherein the filament is configured to emit electrons towards an anode in an electron emitting direction, and wherein the filament at least partially comprises a helical structure. In a second step 312, the filament is aligned with respect to a filament frame structure, wherein the filament frame structure is configured for electron-optical focusing of the emitted electrons, wherein the filament frame structure is provided adjacent to the outer boundaries of the filament, and wherein the filament frame structure comprises frame surface portions arranged transverse to the emitting direction. In a third step 314, the filament is connected to the filament frame structure. In a fourth step 316, a support structure is connected to a body structure. In a fifth step 318, the filament frame structure is placed on the support structure. In a sixth step 320, the filament frame structure and the filament are connected to the support structure.

The first step 310 is also referred to as step a), the second step 312 as step b), the third step 314 as step c), the fourth step 316 as step d), the fifth step 318 as step e), and the sixth step 320 as step f).

The filament frame structure may be connected to the body structure, in addition or instead of being connected to the support structure, for example in case of a ceramic cathode head.

However, it is advantageously, if the filament frame structure is provided such that a movement in combination with the filament is provided in case of thermal expansion.

Figure 14:
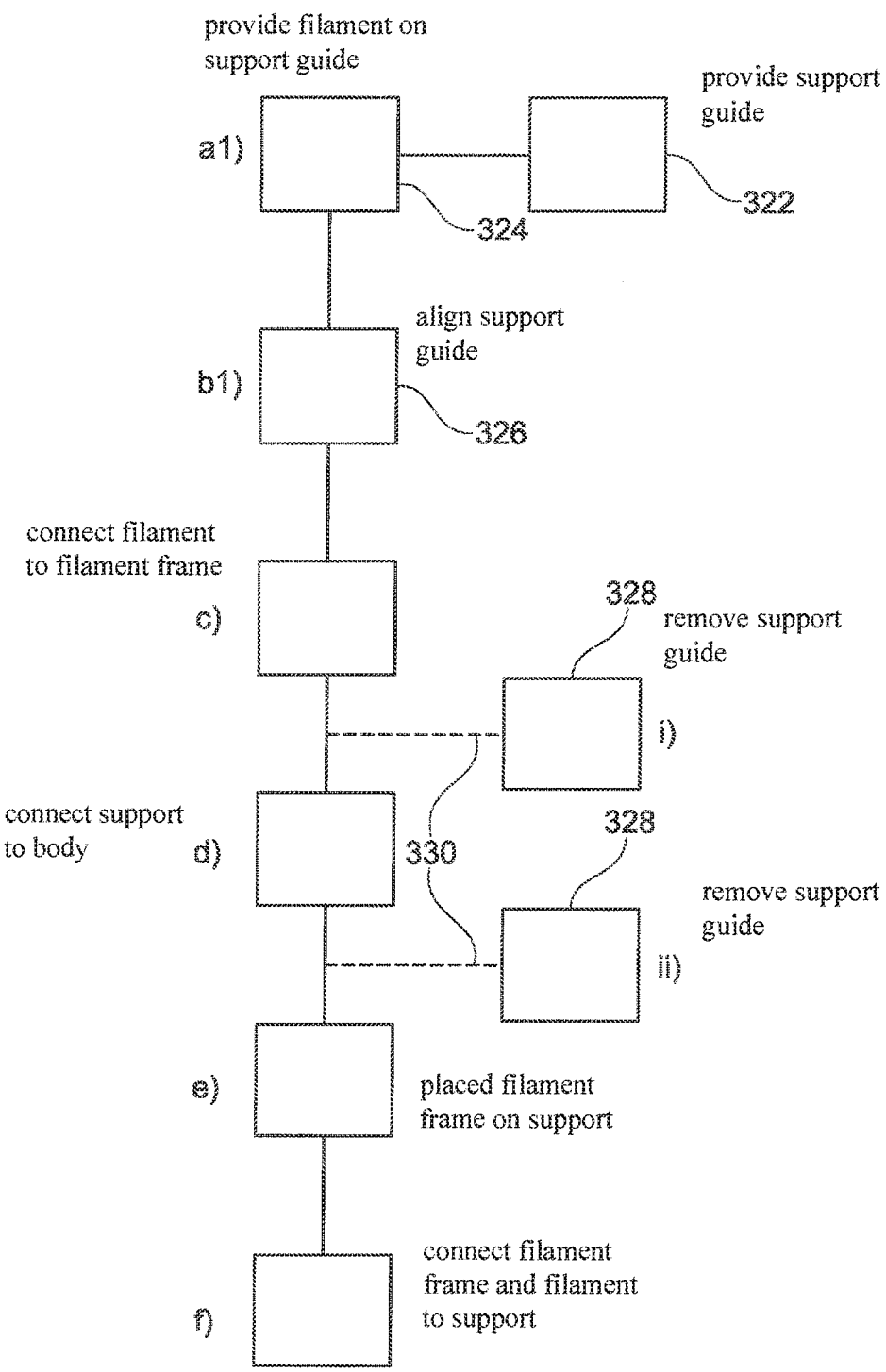
FIG. 14 shows a further example of a method according to the present invention.

According to a further example, shown in FIG. 14, a support guide is provided in a first preparation step 322 for the assembly. Thus, the steps are provided as step a1) in which the filament is provided 324 on the support guide. In a further step b1), the support guide is aligned 326 with respect to the filament frame structure. The support guide is then removed in a further step 328, for example as a step i) after the filament is connected to the filament frame structure, or as step ii) after the filament frame structure is connected to the support structure. This is indicated by dotted lines 330 in FIG. 14 indicating the two possibilities as alternative options.

According to a further example (not further shown), following step a), but before the placing of step e), a total recrystallizing of the filament is provided by applying external heat. The recrystallizing may be provided, for example, before step c).

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A cathode for an X-ray tube, comprising:
a filament;
a support structure;
a body structure; and
a filament frame structure;
wherein the filament is provided to emit electrons towards an anode in an electron emitting direction, and wherein the filament at least partially comprises a helical structure;
wherein the filament is held by the support structure, which is fixedly connected to the body structure;
wherein the filament frame structure is provided for electron-optical focusing of the emitted electrons;
wherein the filament frame structure is provided adjacent to outer boundaries of the filament; and wherein the filament frame structure comprises frame surface portions arranged transverse to the electron emitting direction;
wherein the filament frame structure is held by the support structure; and
wherein the filament frame structure comprises at least one positioning device for at least one positioning direction of the filament in relation with the body structure, the at least one positioning device physically contacting a portion of the filament for positioning the filament in the at least one positioning direction of the filament in relation with the body structure, the at least one positioning device configured for removal from physical contact with the filament when the filament is secured to the support structure.

2. The cathode according to claim 1, wherein the filament is a straight end helical filament, and
wherein connecting ends of the filament are aligned with a longitudinal axis, and a helical winding of the filament is provided around the longitudinal axis.

3. The cathode according to claim 1, wherein the filament frame structure comprises at least a second positioning device for a second positioning direction of the filament in relation with the body structure.

4. The cathode according to claim 1, wherein fitting members for receiving parts of a filament support arrangement is provided at the support structure,
wherein the fitting members have through-holes through which a mounting bolt is configured to extend, and
wherein, as the fitting members, the support structure comprises a reception for receiving two ends of a straight filament mounting-pin as the filament support arrangement, and wherein the mounting-pin is insertable within a coil opening of the filament for correct placing of the filament.

5. The cathode according to claim 4,
wherein fitting members for receiving parts of a filament support arrangement is provided at the filament frame structure; and
wherein, as the fitting members, the filament frame structure comprises a reception for receiving the two ends of the straight filament mounting-pin, and wherein the mounting-pin is insertable within the coil opening of the filament for correct placing of the filament.

6. The cathode according to claim 1, wherein in a non-operating state, the filament is arranged with a pretension provided by the support structure.

7. The cathode according to claim 1, wherein the body structure is provided as a cathode cup,
wherein the cathode cup is provided as a ceramic cathode cup made from electrically non-conducting ceramic, and
wherein a part of surfaces of the cathode cup is provided with a metallic coating.

8. The cathode according to claim 7, wherein the cathode cup is provided with a flat front side, and wherein the filament is arranged on the flat front side.

9. An X-ray tube, comprising:
a cathode;
an anode;
wherein the cathode is provided as a cathode for the X-ray tube, the cathode comprising:
a filament;
a support structure;
a body structure; and
a filament frame structure;
wherein the filament is provided to emit electrons towards an anode in an electron emitting direction, and wherein the filament at least partially comprises a helical structure;
wherein the filament is held by the support structure, which is fixedly connected to the body structure;
wherein the filament frame structure is provided for electron-optical focusing of the emitted electrons, wherein the filament frame structure is provided adjacent to outer boundaries of the filament; and wherein the filament frame structure comprises frame surface portions arranged transverse to the electron emitting direction;

wherein the filament frame structure is held by the support structure; and wherein the filament frame structure comprises at least one positioning device for at least one positioning direction of the filament in relation with the body structure, the at least one positioning device physically contacting a portion of the filament for positioning the filament in the at least one positioning direction of the filament in relation with the body structure, the at least one positioning device configured for removal from physical contact with the filament when the filament is secured to the support structure.

10. A system for X-ray imaging, comprising:
an X-ray source;
an X-ray detector; and
a processing unit;
wherein the processing unit is configured to control the X-ray source and the X-ray detector for providing X-ray image data of an object of interest; and
wherein the X-ray source is provided as an X-ray tube comprising a cathode and an anode, wherein the cathode is provided as a cathode for the X-ray tube, the cathode comprising:
a filament;
a support structure;
a body structure; and
a filament frame structure;
wherein the filament is provided to emit electrons towards an anode in an electron emitting direction, and wherein the filament at least partially comprises a helical structure;
wherein the filament is held by the support structure, which is fixedly connected to the body structure;
wherein the filament frame structure is provided for electron-optical focusing of the emitted electrons, wherein the filament frame structure is provided adjacent to outer boundaries of the filament; and wherein the filament frame structure comprises frame surface portions arranged transverse to the electron emitting direction;
wherein the filament frame structure is held by the support structure; and
wherein the filament frame structure comprises at least one positioning device for at least one positioning direction of the filament in relation with the body structure, the at least one positioning device physically contacting a portion of the filament for positioning the filament in the at least one positioning direction of the filament in relation with the body structure, the at least one positioning device configured for removal from physical contact with the filament when the filament is secured to the support structure.

11. A method for an assembly of a cathode for an X-ray tube, the method comprising acts of:
providing a filament;
wherein the filament is configured to emit electrons towards an anode in an electron emitting direction, and wherein the filament at least partially comprises a helical structure;
aligning the filament with respect to a filament frame structure
wherein the filament frame structure is configured for electron-optical focusing of the emitted electrons, wherein the filament frame structure is provided adjacent to outer boundaries of the filament, wherein the filament frame structure comprises frame surface portions arranged transverse to the electron emitting direction, and wherein the filament frame structure comprises at least one positioning device for at least one positioning direction of the filament in relation with the body structure, the at least one positioning device contacting a portion of the filament for positioning the filament in the at least one positioning direction of the filament in relation with the body structure;
connecting the filament to the filament frame structure;
connecting a support structure to a body structure;
placing the filament frame structure on the support structure;
fixing the filament frame structure and the filament to the support structure; and
removing the at least one positioning device from physical contact with the filament when the filament is secured to the support structure.

12. The Method according to claim 11, wherein a support guide is provided for the assembly, and the method further comprises acts of:
providing the filament on the support guide; and
aligning the support guide with respect to the filament frame structure,
wherein the support guide is removed
after the filament is connected to the filament frame structure, or
after the filament frame structure is fixed to the support structure.

13. The Method according to claim 11, wherein following the providing act, but before the placing act, the method further comprises an act of a total recrystallizing of the filament by applying external heat.

* * * * *